(12) United States Patent
Xia et al.

(10) Patent No.: US 12,525,456 B2
(45) Date of Patent: Jan. 13, 2026

(54) METAL GATE STRUCTURE OF HIGH-VOLTAGE DEVICE AND METHOD FOR MAKING THE SAME

(71) Applicant: Shanghai Huali Integrated Circuit Corporation, Shanghai (CN)

(72) Inventors: Yu Xia, Shanghai (CN); Zhibin He, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 763 days.

(21) Appl. No.: 17/848,531

(22) Filed: Jun. 24, 2022

(65) Prior Publication Data

US 2023/0069801 A1 Mar. 2, 2023

(30) Foreign Application Priority Data

Aug. 24, 2021 (CN) .......................... 202110974201.1

(51) Int. Cl.
| | |
|---|---|
| *H01L 21/28* | (2006.01) |
| *H01L 21/285* | (2006.01) |
| *H10D 64/01* | (2025.01) |
| *H10D 64/62* | (2025.01) |

(52) U.S. Cl.
CPC .. *H01L 21/28247* (2013.01); *H01L 21/28123* (2013.01); *H01L 21/28518* (2013.01); *H10D 64/017* (2025.01); *H10D 64/62* (2025.01)

(58) Field of Classification Search
None
See application file for complete search history.

(56) References Cited

U.S. PATENT DOCUMENTS

| | | | | |
|---|---|---|---|---|
| 2015/0243661 | A1* | 8/2015 | Matsumoto | ........ H10D 84/0179 257/369 |
| 2015/0357429 | A1* | 12/2015 | Dubourdieu | ......... H10D 64/017 257/295 |
| 2021/0343704 | A1* | 11/2021 | Lin | ...................... H10D 62/116 |
| 2022/0013648 | A1* | 1/2022 | Lee | ...................... H10D 64/017 |

* cited by examiner

*Primary Examiner* — Steven B Gauthier
*Assistant Examiner* — Lamont B Koo
(74) *Attorney, Agent, or Firm* — Banner & Witcoff, Ltd.

(57) ABSTRACT

The present application provides a metal gate structure of a high-voltage device and a method for making the same, forming a dummy gate on the gate oxide layer, wherein the dummy gate is composed of a plurality of polysilicon structures spaced apart from each other; forming a protective layer on sidewalls of the plurality of polysilicon structures and on the gate oxide layer between the polysilicon structures; performing covering with an insulating layer to fill a region between the polysilicon structures, wherein the filled region forms an insulating structure; removing the polysilicon structure to form a groove; forming a metal layer, wherein the metal layer covers the insulating structure and fills the groove; and polishing the surface of the metal layer, wherein the insulating structure, the protective layer, and the metal layer form a metal gate with a planarized surface.

6 Claims, 2 Drawing Sheets

METAL GATE STRUCTURE OF HIGH-VOLTAGE DEVICE AND METHOD FOR MAKING THE SAME

CROSS-REFERENCES TO RELATED APPLICATIONS

This application claims priority to Chinese patent application No. 202110974201.1, filed on Aug. 24, 2021, the disclosure of which is incorporated herein by reference in its entirety.

TECHNICAL FIELD

The present application relates to the technical field of semiconductors, in particular to a metal gate structure of a high-voltage device and a method for making the same.

BACKGROUND

With continuous reduction of the transistor size, the high-K dielectric metal gate (HKMG) gradually replaces the original configuration of silicon dioxide insulating layer and polysilicon gate, and becomes an indispensable part of the process below 28 nm.

The metal gate manufacturing process usually includes first depositing metal by means of physical vapor deposition (PVD) or chemical vapor deposition (CVD) and then removing excess metal by means of chemical mechanical polishing (CMP), so as to remain the desired metal gate portion.

The chemical mechanical polishing process may produce different pattern loadings for metal gates of different sizes, and an excessively large metal gate may undergo over-polishing, resulting in a dishing phenomenon. Therefore, in the HKMG process, there is usually a restriction on the size of the metal gate, so as to avoid an excessively large metal gate area.

In the high-voltage device manufacturing process, due to the special requirement of a high voltage, the metal gate may inevitably have the problem of an excessively large area, and the size cannot be restricted by design rules.

BRIEF SUMMARY

In view of the above defect in the prior art, the objective of the present application is to provide a metal gate structure of a high-voltage device and a method for making the same, so as to solve the problem in the prior art that over-polishing occurs during a polishing process due to a large area of the metal gate structure of the high-voltage device, resulting in a negative effect of the device.

In order to achieve the above objective and other related objectives, the present application provides a method for making a metal gate structure of a high-voltage device, at least including:

step 1, providing a silicon substrate, the silicon substrate being provided with an active region, forming a gate oxide layer on the active region, and forming a dummy gate on the gate oxide layer, wherein the dummy gate is composed of a plurality of polysilicon structures spaced apart from each other;

step 2, forming a protective layer on sidewalls of the plurality of polysilicon structures and on the gate oxide layer between the polysilicon structures;

step 3, performing covering with an insulating layer to fill a region between the polysilicon structures, wherein the filled region forms an insulating structure;

step 4, removing the polysilicon structure to form a groove;

step 5, forming a metal layer, wherein the metal layer covers the insulating structure and fills the groove; and step 6: polishing the surface of the metal layer, wherein the insulating structure, the protective layer, and the metal layer form a metal gate with a planarized surface.

In some examples, the method of forming the dummy gate on the gate oxide layer in step 1 is: first forming a polysilicon layer covering the gate oxide layer on the active region; and then etching the polysilicon layer to form the dummy gate.

In some examples, the method of forming the protective layer on the sidewalls of the plurality of polysilicon structures in step 2 includes: (1) depositing a protective layer covering the surfaces of the plurality of polysilicon structures and the surface of the gate oxide layer between the polysilicon structures; and (2) removing the protective layer on the top of the plurality of polysilicon structures by means of photolithography and etching, so as to remain the protective layer on the sidewalls of the plurality of polysilicon structures and on the surface of the gate oxide layer between the polysilicon structures.

In some examples, before forming the insulating layer in step 3, a NiSi layer is first formed on the upper surface of the active region at two sides of the gate oxide layer.

In some examples, the insulating layer in step 3 is a silicon oxide layer or a silicon nitride layer.

In some examples, the polishing in step 6 is chemical mechanical polishing.

The present application provides a metal gate structure of a high-voltage device, at least including:

a silicon substrate; an active region provided on the silicon substrate; a gate oxide layer formed on the active region; a NiSi layer formed on the active region at two sides of the gate oxide layer; insulating structures spaced apart from each other and formed on the gate oxide layer; a groove formed by a region between the insulating structures; a protective layer formed on the sidewall of the groove and the bottom of the insulating structure; and metal filling the groove; wherein the insulating structure, the protective layer, and a metal layer form a metal gate with a planarized surface.

As stated above, the metal gate structure of a high-voltage device and method for making the same of the preset application have the following beneficial effects: the metal gate structure and method for making the same of the present application can avoid over-polishing of the metal gate on the premise of retaining a large area of the metal gate of the high-voltage device, eliminating the negative effect generated by the over-polishing and improving the performance of the device.

DETAILED DESCRIPTION OF THE DISCLOSURE

The embodiments of the present application are described below using specific examples, and those skilled in the art can easily understand other advantages and effects of the present application from the contents disclosed in the Description. The present application can also be implemented or applied using other different specific embodiments, and various details in the Description can also be modified or changed based on different viewpoints and applications without departing from the spirit of the present application.

Please refer to FIGS. 1-5. It should be noted that the drawings provided in this embodiment are only used to illustrate the basic concept of the present application in a schematic way, so the drawings only show the components related to the present application rather than being drawn according to the number, shape and size of the components in actual implementation. The type, number and proportion of various components can be changed randomly during actual implementation, and the layout of components may be more complicated.

The present application provides a method for making a metal gate structure of a high-voltage device, at least including the following steps.

Figure 1:
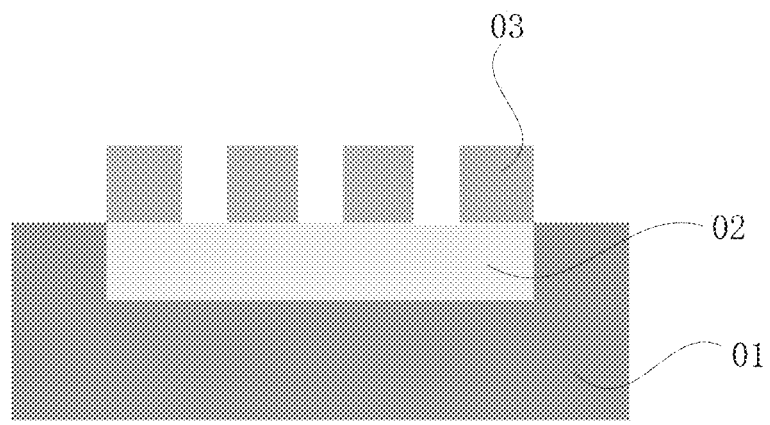
FIG. 1 illustrates a schematic diagram of a structure formed after an active region, a gate oxide layer, and a dummy gate are formed on a silicon substrate in the preset application.

Step 1. A silicon substrate is provided, the silicon substrate being provided with an active region, a gate oxide layer is formed on the active region, and a dummy gate is formed on the gate oxide layer, wherein the dummy gate is composed of a plurality of polysilicon structures spaced apart from each other. Referring to FIG. 1, FIG. 1 is a schematic diagram of a structure formed after the active region, the gate oxide layer, and the dummy gate are formed on the silicon substrate in the preset application. In step 1, the active region 01 is disposed on the silicon substrate, the gate oxide layer 02 is formed on the active region 01, the dummy gate is formed on the gate oxide layer 02, and the dummy gate is composed of the plurality of polysilicon structures 03 spaced apart from each other.

Figure 5:
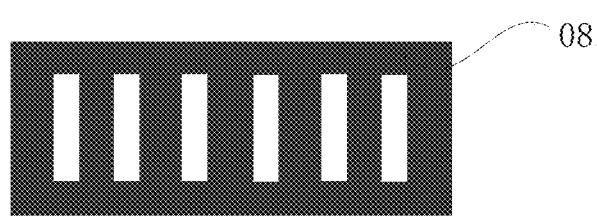
FIG. 5 illustrates a schematic diagram of a dummy gate mask in the present application.

In this embodiment of the present application, the method of forming the dummy gate on the gate oxide layer 02 in step 1 is: first forming a polysilicon layer covering the gate oxide layer 02 on the active region 01; and then etching the polysilicon layer to form the dummy gate. In this embodiment, before the polysilicon layer is etched, a photoresist is first applied on the polysilicon layer, then a mask 08 shown in FIG. 5 is used to perform exposure, then development is performed, and finally etching is performed to form the plurality of polysilicon structures 03. FIG. 5 is a schematic diagram of the dummy gate mask in the present application.

Figure 2:
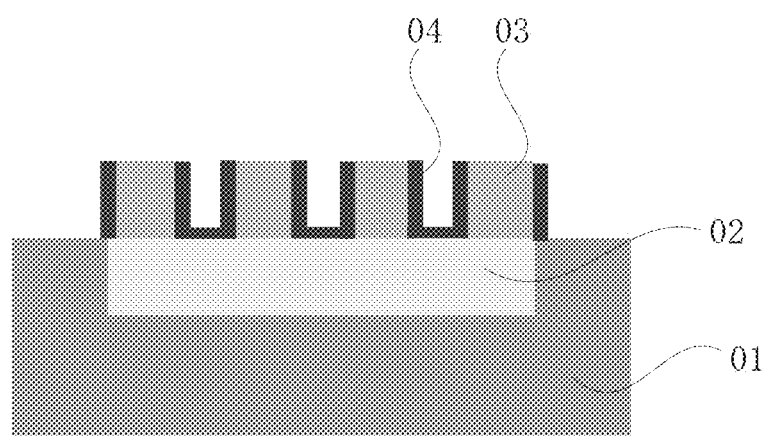
FIG. 2 illustrates a schematic diagram of a structure formed after a protective layer is formed in the present application.

Step 2. A protective layer is formed on sidewalls of the plurality of polysilicon structures and on the gate oxide layer between the polysilicon structures. Referring to FIG. 2, FIG. 2 is a schematic diagram of a structure formed after the protective layer is formed in the present application. In step 2, the protective layer 04 is formed on the sidewalls of the plurality of polysilicon structures 03 and on the gate oxide layer 02 between the polysilicon structures 03.

In this embodiment of the present application, the method of forming the protective layer on the sidewalls of the plurality of polysilicon structures in step 2 includes: (1) depositing a protective layer covering the surfaces of the plurality of polysilicon structures 03 and the surface of the gate oxide layer 02 between the polysilicon structures; and (2) removing the protective layer 04 on the top of the plurality of polysilicon structures 03 by means of photolithography and etching, so as to remain the protective layer 04 on the sidewalls of the plurality of polysilicon structures and on the surface of the gate oxide layer between the polysilicon structures.

Figure 3:
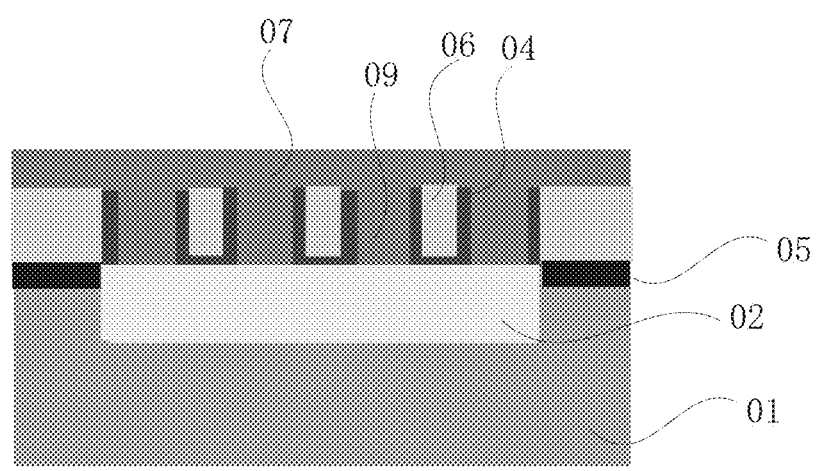
FIG. 3 illustrates a schematic diagram of a structure formed after an insulating structure and a metal layer are formed in the present application.

Step 3. Covering with an insulating layer is performed to fill a region between the polysilicon structures, wherein the filled region forms an insulating structure. Referring to FIG. 3, FIG. 3 is a schematic diagram of a structure formed after the insulating structure and a metal layer are formed in the present application. In step 3, the covering with the insulating layer is performed to fill the region between the polysilicon structures, wherein the filled region forms the insulating structure 06.

In this embodiment of the present application, the insulating layer in step 3 is a silicon oxide layer or a silicon nitride layer.

In an example, before forming the insulating layer in step 3, a NiSi layer 05 is first formed on the upper surface of the active region at two sides of the gate oxide layer.

Step 4. The polysilicon structure is removed to form a groove.

Step 5. A metal layer is formed, wherein the metal layer covers the insulating structure and fills the groove. Referring to FIG. 3, in step 5, the metal layer 07 is formed, wherein the metal layer 07 covers the insulating structure 06 and fills the groove 09.

Figure 4:
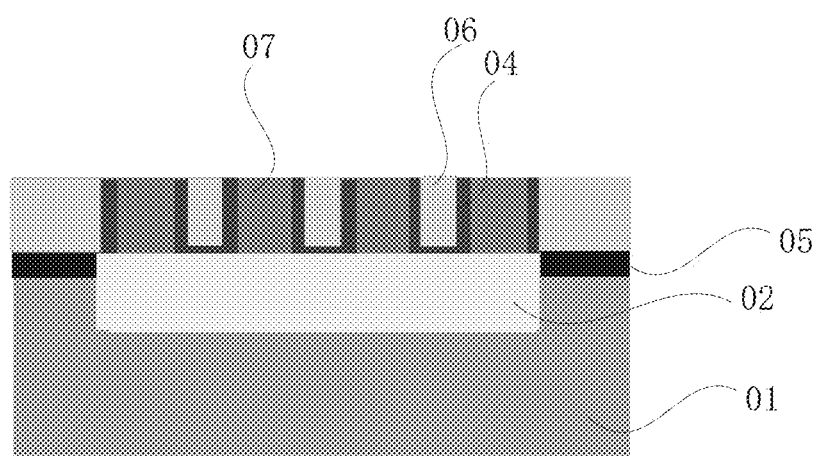
FIG. 4 illustrates a schematic diagram of a structure formed after a metal gate with a planarized surface is formed in the present application.

Step 6. The surface of the metal layer is polished, wherein the insulating structure, the protective layer, and the metal layer form a metal gate with a planarized surface. Referring to FIG. 4, FIG. 4 is a schematic diagram of a structure formed after the metal gate with the planarized surface is formed in the present application. In step 6, the surface of the metal layer is polished, wherein the insulating structure 06, the protective layer 04, and the metal layer 07 form the metal gate with the planarized surface. In this embodiment, in step 6, the surface of the metal layer is polished until the upper surface of the insulating structure is exposed.

In this embodiment of the present application, the polishing in step 6 is chemical mechanical polishing.

The present application further provides a metal gate structure of a high-voltage device, referring to FIG. 4, at least including:

a silicon substrate; an active region 01 provided on the silicon substrate; a gate oxide layer 02 formed on the active region 01; a NiSi layer 05 formed on the active region 01 at two sides of the gate oxide layer 02; insulating structures 06 spaced apart from each other and formed on the gate oxide layer 02; a groove formed by a region between the insulating structures 06; a protective layer 04 formed on the sidewall of the groove and the bottom of the insulating structure 06; and metal 07 filling the groove; wherein the insulating structure 06, the protective layer 04, and the metal layer 07 form a metal gate with a planarized surface. In this embodiment, the upper surface of the metal layer 07 is level with the upper surface of the insulating structure 06.

To sum up, the metal gate structure and method for making the same of the present application can avoid over-polishing of the metal gate on the premise of retaining a large area of the metal gate of the high-voltage device, eliminating the negative effect generated by the over-polishing and improving the performance of the device. Therefore, the present application effectively overcomes various defects in the prior art and has high industrial utilization value.

The above embodiment merely illustrates the principle and effect of the present application, rather than limiting the present application. Anyone skilled in the art can modify or change the above embodiment without departing from the spirit and scope of the present application. Therefore, all equivalent modifications or changes made by those with ordinary knowledge in the art without departing from the spirit and technical idea disclosed in the present application shall still be covered by the claims of the present application.

What is claimed is:

1. A method for making a metal gate structure of a high-voltage device, comprising:
    step 1, providing a silicon substrate, the silicon substrate being provided with an active region of the high-voltage device, forming a gate oxide layer on the active region of the high-voltage device, and forming a dummy gate on the gate oxide layer of the high-voltage device, wherein the dummy gate of the high-voltage device is composed of a plurality of polysilicon structures spaced apart from each other;
    step 2, forming a protective layer on sidewalls of the plurality of polysilicon structures of the high-voltage device and on the gate oxide layer between the polysilicon structures of the high-voltage device;
    step 3, performing covering with an insulating layer to fill regions between the plurality of polysilicon structures of the high-voltage device, wherein the filled regions form an insulating structure;
    step 4, removing the plurality of polysilicon structures of the high-voltage device to form a plurality of grooves;
    step 5, forming a metal layer of the high-voltage device, wherein the metal layer covers the insulating structure and fills the plurality of grooves of the high-voltage device; and
    step 6: polishing a surface of the metal layer, wherein the insulating structure, the protective layer, and the metal layer form a metal gate with a planarized surface of the high-voltage device.

2. The method for making the metal gate structure of the high-voltage device according to claim 1, wherein the method of forming the dummy gate on the gate oxide layer in step 1 is: first forming a polysilicon layer covering the gate oxide layer on the active region; and then etching the polysilicon layer to form the dummy gate.

3. The method for making the metal gate structure of the high-voltage device according to claim 1, wherein the method of forming the protective layer on the sidewalls of the plurality of polysilicon structures in step 2 comprises: (1) depositing a protective layer covering surfaces of the plurality of polysilicon structures and a surface of the gate oxide layer between the polysilicon structures; and (2) removing the protective layer on a top of the plurality of polysilicon structures by means of photolithography and etching, so as to remain the protective layer on the sidewalls of the plurality of polysilicon structures and on the surface of the gate oxide layer between the polysilicon structures.

4. The method for making the metal gate structure of the high-voltage device according to claim 1, wherein before forming the insulating layer in step 3, a NiSi layer is first formed on an upper surface of the active region at two sides of the gate oxide layer.

5. The method for making the metal gate structure of the high-voltage device according to claim 1, wherein the insulating layer in step 3 is a silicon oxide layer or a silicon nitride layer.

6. The method for making the metal gate structure of the high-voltage device according to claim 1, wherein the polishing in step 6 is chemical mechanical polishing.

* * * * *